US008623171B2

(12) United States Patent
Godet et al.

(10) Patent No.: US 8,623,171 B2
(45) Date of Patent: *Jan. 7, 2014

(54) PLASMA PROCESSING APPARATUS

(75) Inventors: Ludovic Godet, North Reading, MA (US); Timothy J. Miller, Ipswich, MA (US); Christopher J. Leavitt, Gloucester, MA (US); Bernard G. Lindsay, Danvers, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 930 days.

This patent is subject to a terminal disclaimer.

(21) Appl. No.: 12/418,120

(22) Filed: Apr. 3, 2009

(65) Prior Publication Data
US 2010/0255683 A1 Oct. 7, 2010

(51) Int. Cl.
*H01L 21/306* (2006.01)
*C23C 16/00* (2006.01)

(52) U.S. Cl.
USPC .............. 156/345.3; 156/345.41; 156/345.47; 156/345.48; 118/723 R; 118/723 I; 118/723 E; 118/723 MW; 118/504

(58) Field of Classification Search
USPC ..... 118/723 R, 723 E, 723 ER, 723 I, 723 IR, 118/723 AN, 723 MW, 723 ME, 723 MR, 118/723 MA, 728, 729, 730, 504; 156/345.3, 345.41, 345.42, 345.43, 156/345.47, 345.48, 345.49, 345.51, 156/345.52, 345.53, 345.54
See application file for complete search history.

(56) References Cited

U.S. PATENT DOCUMENTS

| | | | |
|---|---|---|---|
| 5,107,170 A | 4/1992 | Ishikawa et al. | |
| 5,954,887 A | 9/1999 | Hatano | |
| 6,527,911 B1* | 3/2003 | Yen et al. | 156/345.43 |
| 6,647,993 B2 | 11/2003 | Shang et al. | |
| 6,730,197 B2 | 5/2004 | Wang et al. | |
| 6,803,590 B2 | 10/2004 | Brailove et al. | |
| 7,767,977 B1* | 8/2010 | Godet et al. | 250/423 R |
| 8,101,510 B2* | 1/2012 | Godet et al. | 438/513 |
| 2001/0042827 A1 | 11/2001 | Fang et al. | |
| 2003/0141831 A1 | 7/2003 | Chen | |
| 2004/0251424 A1 | 12/2004 | Murata et al. | |
| 2005/0051517 A1* | 3/2005 | Oehrlein et al. | 216/67 |
| 2006/0236931 A1* | 10/2006 | Singh et al. | 118/723 E |
| 2008/0067430 A1 | 3/2008 | Hershkowitz et al. | |
| 2008/0132046 A1 | 6/2008 | Walther | |

(Continued)

FOREIGN PATENT DOCUMENTS

| | | |
|---|---|---|
| JP | 8138595 A | 5/1996 |
| JP | 2006054334 A | 2/2006 |

(Continued)

*Primary Examiner* — Luz Alejandro Mulero

(57) ABSTRACT

A plasma processing apparatus includes a process chamber, a platen positioned in the process chamber for supporting a workpiece, a source configured to generate a plasma in the process chamber having a plasma sheath adjacent to the front surface of the workpiece, and an insulating modifier. The insulting modifier is configured to control a shape of a boundary between the plasma and the plasma sheath so a portion of the shape of the boundary is not parallel to a plane defined by a front surface of the workpiece facing the plasma. Controlling the shape of the boundary between the plasma and the plasma sheath enables a large range of incident angles of particles striking the workpiece to be achieved.

9 Claims, 8 Drawing Sheets

(56) References Cited

U.S. PATENT DOCUMENTS

| | | |
|---|---|---|
| 2008/0179546 A1 | 7/2008 | Lee et al. |
| 2008/0242065 A1 | 10/2008 | Brcka |
| 2009/0061605 A1 | 3/2009 | Godet et al. |
| 2009/0084987 A1 | 4/2009 | Godet et al. |
| 2011/0186749 A1* | 8/2011 | Godet et al. .................. 250/424 |
| 2012/0082942 A1* | 4/2012 | Godet et al. .................. 430/322 |
| 2012/0111834 A1* | 5/2012 | Godet et al. .................. 216/67 |

FOREIGN PATENT DOCUMENTS

| | | |
|---|---|---|
| JP | 2006278006 A | 10/2006 |
| JP | 2007273368 A | 10/2007 |
| KR | 10200000033006 A | 6/2000 |
| WO | 20100040805 A1 | 4/2010 |

* cited by examiner

PLASMA PROCESSING APPARATUS

CROSS REFERENCE TO RELATED APPLICATIONS

This application is related to U.S. application Ser. No. 12/417,929 filed Apr. 3, 2009, which is incorporated herein by reference.

FIELD

This disclosure relates to plasma processing, and more particularly to a plasma processing apparatus.

BACKGROUND

A plasma processing apparatus generates a plasma in a process chamber for treating a workpiece supported by a platen in the process chamber. A plasma processing apparatus may include, but not be limited to, doping systems, etching systems, and deposition systems. The plasma is generally a quasi-neutral collection of ions (usually having a positive charge) and electrons (having a negative charge). The plasma has an electric field of about 0 volts per centimeter in the bulk of the plasma. In some plasma processing apparatus, ions from the plasma are attracted towards a workpiece. In a plasma doping apparatus, ions may be attracted with sufficient energy to be implanted into the physical structure of the workpiece, e.g., a semiconductor substrate in one instance.

The plasma is bounded by a region proximate the workpiece generally referred to as a plasma sheath. The plasma sheath is a region that has fewer electrons than the plasma. The light emission from this plasma sheath is less intense than the plasma since fewer electrons are present and hence few excitation-relaxation collisions occur. Hence, the plasma sheath is sometimes referred to as "dark space."

Turning to FIG. 1, a cross sectional view of portions of a known plasma processing apparatus is illustrated where a plasma 140 has a plasma sheath 142 adjacent to a front surface of a workpiece 138 to be treated. The front surface of the workpiece 138 defines a plane 151, and the workpiece 138 is supported by a platen 134. The boundary 141 between the plasma 140 and the plasma sheath 142 is parallel to the plane 151. Ions 102 from the plasma 140 may be attracted across the plasma sheath 142 towards the workpiece 138. Accordingly, the ions 102 that are accelerated towards the workpiece 138 generally strike the workpiece 138 at about a 0° angle of incidence relative to the plane 151 (e.g., perpendicular to the plane 151). There can be a small angular spread of the angle of incidence of less than about 3°. In addition, by controlling plasma process parameters such as gas pressure within a process chamber, the angular spread may be increased up to about 5°.

A drawback with conventional plasma processing is the lack of angular spread control of the ions 102. As structures on the workpiece become smaller and as three dimensional structures become more common (e.g., trench capacitors, vertical channel transistors such as FinFETs) it would be beneficial to have greater angle control. For example, a trench 144 having an exaggerated size for clarity of illustration is shown in FIG. 1. With ions 102 being directed at about a 0° angle of incidence or an even angular spread up to 5°, it can be difficult to uniformly treat the sidewalls 147 of the trench 144.

Accordingly, there is a need for a plasma processing apparatus which overcomes the above-described inadequacies and shortcomings.

SUMMARY

According to a first aspect of the disclosure, a plasma processing apparatus is provided. The plasma processing apparatus includes a process chamber, a platen positioned in the process chamber for supporting a workpiece, a source configured to generate a plasma in the process chamber having a plasma sheath adjacent to the front surface of the workpiece, and an insulating modifier. The insulating modifier is configured to control a shape of a boundary between the plasma and the plasma sheath so a portion of the shape of the boundary is not parallel to a plane defined by a front surface of the workpiece facing the plasma According to another aspect of the disclosure, a method is provided. The method includes positioning a workpiece in a process chamber, generating a plasma in the process chamber having a plasma sheath adjacent to the front surface of the workpiece, and modifying a shape of a boundary between the plasma and the plasma sheath with an insulating modifier so a portion of the shape of the boundary is not parallel to a plane defined by a front surface of the workpiece facing the plasma.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 2:
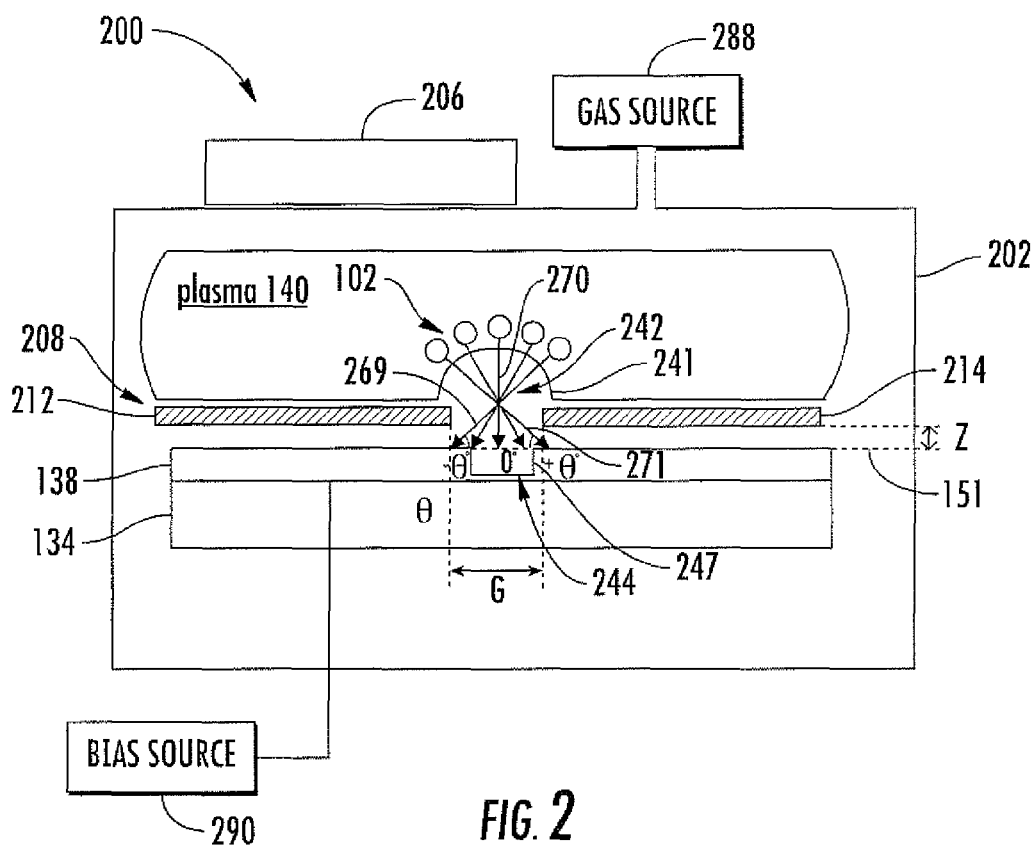
FIG. 2 is a block diagram of a plasma processing apparatus consistent with an embodiment of the disclosure.

FIG. 2 is a block diagram of one plasma processing apparatus 200 having an insulating modifier 208 consistent with an embodiment of the disclosure. The insulating modifier 208 is configured to modify an electric field within the plasma sheath 242 to control a shape of a boundary 241 between the plasma 140 and the plasma sheath 242. Accordingly, ions 102 that are attracted from the plasma 140 across the plasma sheath 242 may strike the workpiece 138 at a large range of incident angles.

The plasma processing apparatus 200 may be further described herein as a plasma doping apparatus. However, the plasma processing apparatus 200 may also include, but not be limited to, etching and deposition systems. Furthermore, a plasma doping system can perform many differing material modification processes on a treated workpiece. One such process includes doping a workpiece, such as a semiconductor substrate, with a desired dopant.

The plasma processing apparatus 200 may include a process chamber 202, a platen 134, a source 206, and the insulating modifier 208. The platen 134 is positioned in the process chamber 202 for supporting the workpiece 138. The workpiece may include, but not be limited to, a semiconductor wafer, flat panel, solar panel, and polymer substrate. The semiconductor wafer may have a disk shape with a diameter of 300 millimeters (mm) in one embodiment. The source 206 is configured to generate the plasma 140 in the process chamber 202 as is known in the art. In the embodiment of FIG. 2, the insulting modifier 208 includes a pair of insulators 212 and 214 defining a gap there between having a horizontal spacing (G). In other embodiments, the insulating modifier may include only one insulator. The pair of insulators 212 and 214 may be a pair of sheets having a thin, flat shape. In other embodiments, the pair of insulators 212 and 214 may be other shapes such as tube shaped, wedge shaped, and/or have a beveled edge proximate the gap.

In one embodiment, the horizontal spacing of the gap defined by the pair of insulators 212 and 214 may be about 6.0 millimeters (mm). The pair of insulators 212 and 214 may also be positioned a vertical spacing (Z) above the plane 151 defined by the front surface of the workpiece 138. In one embodiment, the vertical spacing (Z) may be about 3.0 mm.

In operation, a gas source 288 supplies an ionizable gas to the process chamber 202. Examples of an ionizable gas include, but are not limited to, $BF_3$, $BI_3$, $N_2$, Ar, $PH_3$, $AsH_3$, $B_2H_6$, $H_2$, Xe, Kr, Ne, He, $SiH_4$, $SiF_4$, $GeH_4$, $GeF_4$, $CH_4$, $CF_4$, $AsF_5$, $PF_3$, and $PF_5$. The source 206 may generate the plasma 140 by exciting and ionizing the gas provided to the process chamber 202. Ions may be attracted from the plasma 140 across the plasma sheath 242 by different mechanisms. In the embodiment of FIG. 2, the bias source 290 is configured to bias the workpiece 138 to attract ions 102 from the plasma 140 across the plasma sheath 242. The bias source 290 may be a DC power supply to provide a DC voltage bias signal or an RF power supply to provide an RF bias signal.

Advantageously, the insulating modifier 208 modifies the electric field is within the plasma sheath 242 to control a shape of the boundary 241 between the plasma 140 and the plasma sheath 242. In the embodiment of FIG. 2, the insulating modifier 208 includes a pair of insulators 212 and 214. The insulators 212, 214 may be fabricated of quartz, alumina, boron nitride, glass, silicon nitride, etc. The boundary 241 between the plasma 140 and the plasma sheath 242 may have a convex shape relative to the plane 151. When the bias source 290 biases the workpiece 138, ions 102 are attracted across the plasma sheath 242 through the gap between the insulators 212 and 214 at a large range of incident angles. For instance, ions following trajectory path 271 may strike the workpiece 138 at an angle of $+\theta°$ relative to the plane 151. Ions following trajectory path 270 may strike the workpiece 138 at about an angle of 0° relative to the same plane 151.

Figure 1:
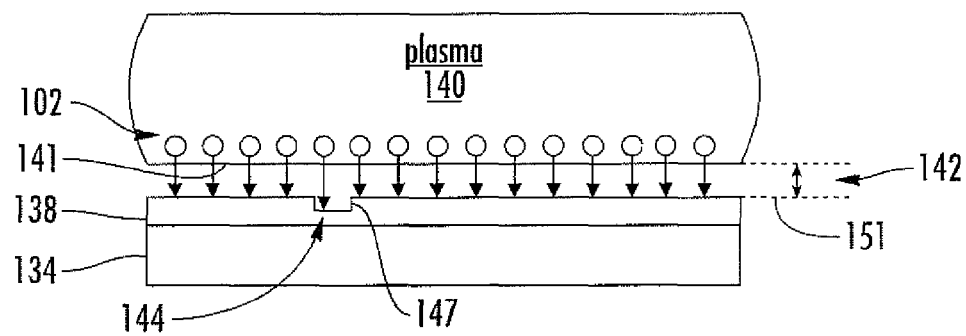
FIG. 1 is a simplified block diagram of a conventional plasma processing apparatus consistent with the prior art.

Ions following trajectory path 269 may strike the workpiece 138 an angle of $-\theta°$ relative to the plane 151. Accordingly, the range of incident angles may be between $+\theta°$ and $-\theta°$ centered about 0°. In addition, some ion trajectories paths such as paths 269 and 271 may cross each other. Depending on a number of factors including, but not limited to, the horizontal spacing (G) between the insulators 212 and 214, the vertical spacing (Z) of the insulators above the plane 151, the dielectric constant of the insulators 212 and 214, and other plasma process parameters, the range of incident angles ($\theta$) may be between +60° and −60° centered about 0°. Hence, small three dimensional structures on the workpiece 138 may be treated uniformly by the ions 102. For example, the sidewalls 247 of the trench 244 having an exaggerated size for clarity of illustration may be more uniformly treated by the ions 102 compared to that of FIG. 1.

Figure 3:
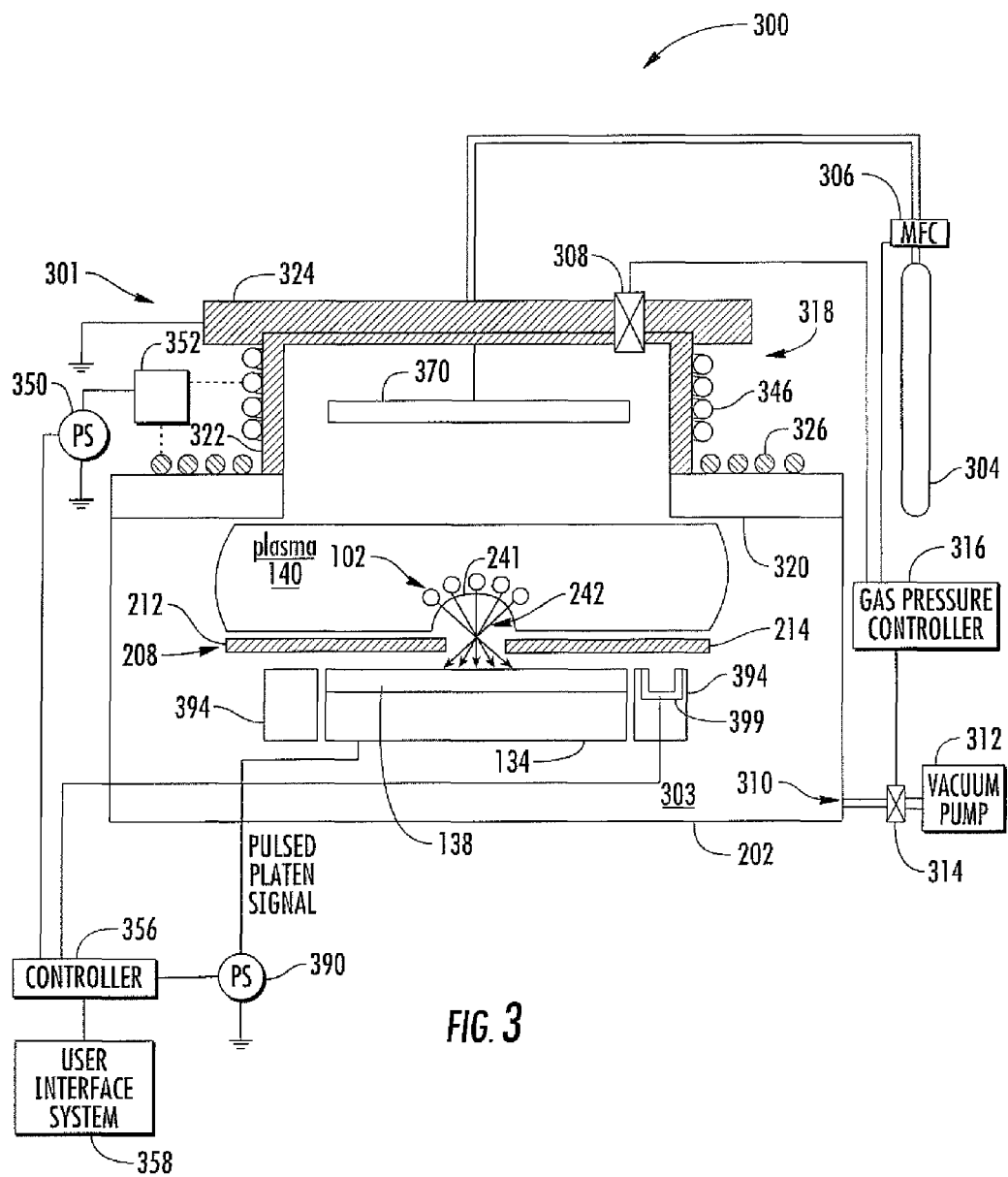
FIG. 3 is a block diagram of a plasma doping apparatus consistent with an embodiment of the disclosure.

Turning to FIG. 3, a block diagram of one exemplary plasma doping apparatus 300 is illustrated. Consistent with the apparatus of FIG. 2, the plasma doping apparatus 300 has the pair of insulators 212 and 214 to control a shape of the boundary 241 between the plasma 140 and the plasma sheath 242.

The plasma doping apparatus 300 includes a process chamber 202 defining an enclosed volume 303. A gas source 304 provides a primary dopant gas to the enclosed volume 303 of the process chamber 302 through the mass flow controller 306. A gas baffle 370 may be positioned in the process chamber 202 to deflect the flow of gas from the gas source 304. A pressure gauge 308 measures the pressure inside the process chamber 202. A vacuum pump 312 evacuates exhausts from the process chamber 202 through an exhaust port 310. An exhaust valve 314 controls the exhaust conductance through the exhaust port 310.

The plasma doping apparatus 300 may further includes a gas pressure controller 316 that is electrically connected to the mass flow controller 306, the pressure gauge 308, and the exhaust valve 314. The gas pressure controller 316 may be configured to maintain a desired pressure in the process chamber 202 by controlling either the exhaust conductance with the exhaust valve 314 or a process gas flow rate with the mass flow controller 306 in a feedback loop that is responsive to the pressure gauge 308.

The process chamber 202 may have a chamber top 318 that includes a first section 320 formed of a dielectric material that extends in a generally horizontal direction. The chamber top 318 also includes a second section 322 formed of a dielectric material that extends a height from the first section 320 in a generally vertical direction. The chamber top 318 further includes a lid 324 formed of an electrically and thermally conductive material that extends across the second section 322 in a horizontal direction.

The plasma doping apparatus further includes a source 301 configured to generate a plasma 140 within the process chamber 202. The source 301 may include a RF source 350 such as a power supply to supply RF power to either one or both of the planar antenna 326 and the helical antenna 346 to generate the plasma 140. The RF source 350 may be coupled to the antennas 326, 346 by an impedance matching network 352 that matches the output impedance of the RF source 350 to the impedance of the RF antennas 326, 346 in order to maximize the power transferred from the RF source 350 to the RF antennas 326, 346. The plasma doping apparatus may also include a bias power supply 390 electrically coupled to the platen 134. The plasma doping system may further include a controller 356 and a user interface system 358. The controller 356 can be or include a general-purpose computer or network of general-purpose computers that may be programmed to perform desired input/output functions. The controller 356 may also include communication devices, data storage devices, and software. The user interface system 358 may include devices such as touch screens, keyboards, user pointing devices, displays, printers, etc. to allow a user to input commands and/or data and/or to monitor the plasma doping apparatus via the controller 356. A shield ring 394 may be disposed around the platen 134 to improve the uniformity of implanted ion distribution near the edge of the workpiece 138. One or more Faraday sensors such as Faraday cup 399 may also be positioned in the shield ring 394 to sense ion beam current.

In operation, the gas source 304 supplies a primary dopant gas containing a desired dopant for implantation into the workpiece 138. The source 301 is configured to generate the plasma 140 within the process chamber 302. The source 301 may be controlled by the controller 356. To generate the plasma 140, the RF source 350 resonates RF currents in at least one of the RF antennas 326, 346 to produce an oscillating magnetic field. The oscillating magnetic field induces RF currents into the process chamber 202. The RF currents in the process chamber 202 excite and ionize the primary dopant gas to generate the plasma 140.

The bias power supply 390 provides a pulsed platen signal having a pulse ON and OFF periods to bias the platen 134 and hence the workpiece 138 to accelerate ions from the plasma 140 towards the workpiece 138 across the plasma sheath 242. The ions 102 may be positively charged ions and hence the pulse ON periods of the pulsed platen signal may be negative voltage pulses with respect to the process chamber 202 to attract the positively charged ions 102. The frequency of the pulsed platen signal and/or the duty cycle of the pulses may be selected to provide a desired dose rate. The amplitude of the pulsed platen signal may be selected to provide a desired energy.

Advantageously, the pair of insulators 212 and 214 controls the shape of the boundary 241 between the plasma 140 and the plasma sheath 242 as previously detailed with respect to FIG. 2. Therefore, the ions 102 may be attracted across the plasma sheath 242 through the gap between the insulators 212 and 214 at a large range of incident angles for doping the workpiece 138.

Figure 4:
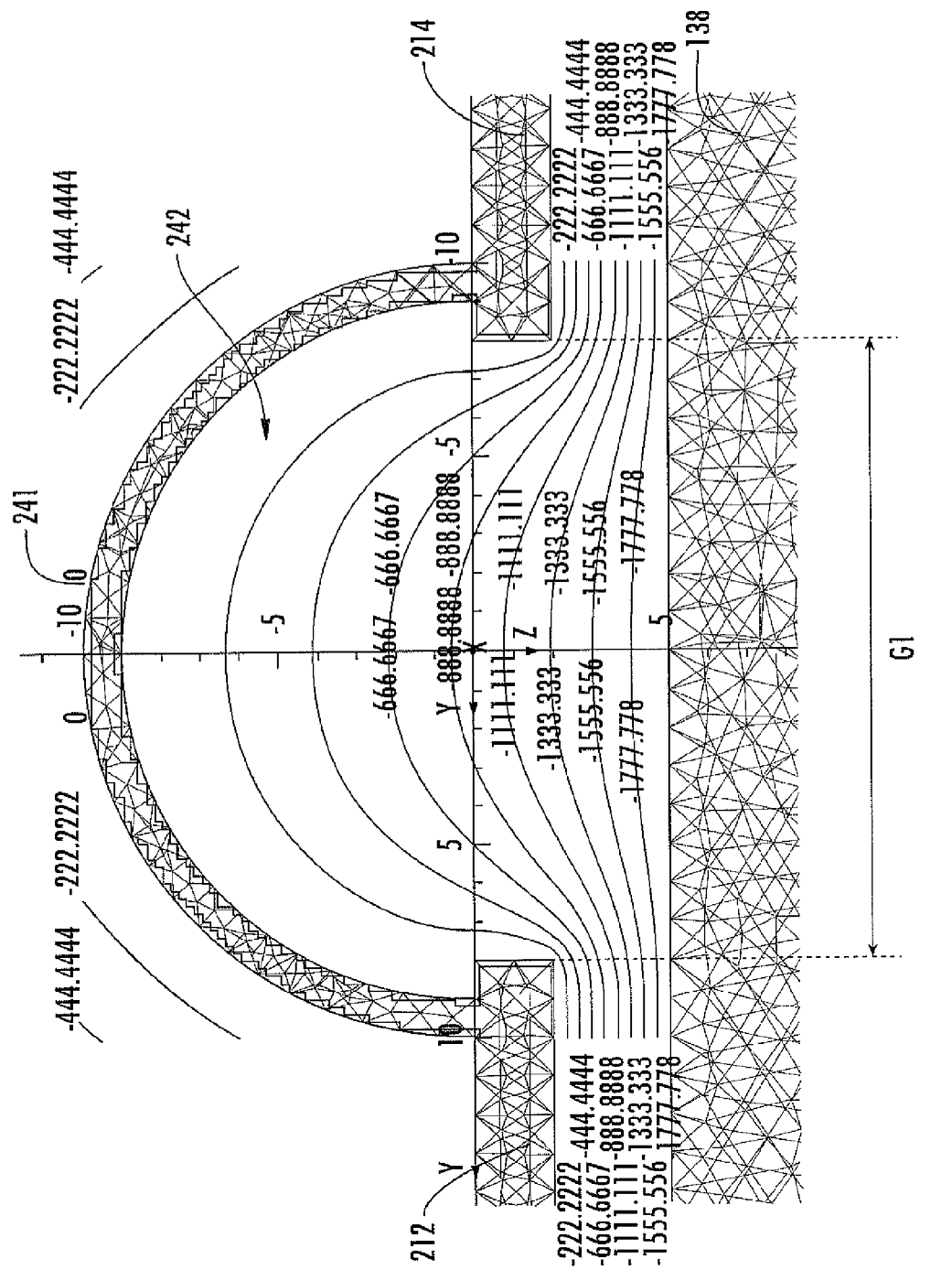
FIG. 4 is a cross sectional view of a pair of insulators to control a shape of a boundary between a plasma and a plasma sheath.

Turning to FIG. 4, a partial cross sectional view of the pair of insulators 212 and 214 and workpiece 138 is illustrated showing the electric field lines in the plasma sheath 242 about the gap defined by the insulators 212 and 214. The electric field lines and resulting arcuate boundary 241 between the plasma and the plasma sheath 242 resulted from a computer simulation with the workpiece 138 biased at −2,000 volts and the insulators 212 and 214 fabricated of glass. As illustrated, the arcuate boundary 241 about the gap may further have a convex to shape relative to the plane 151.

Figure 5:
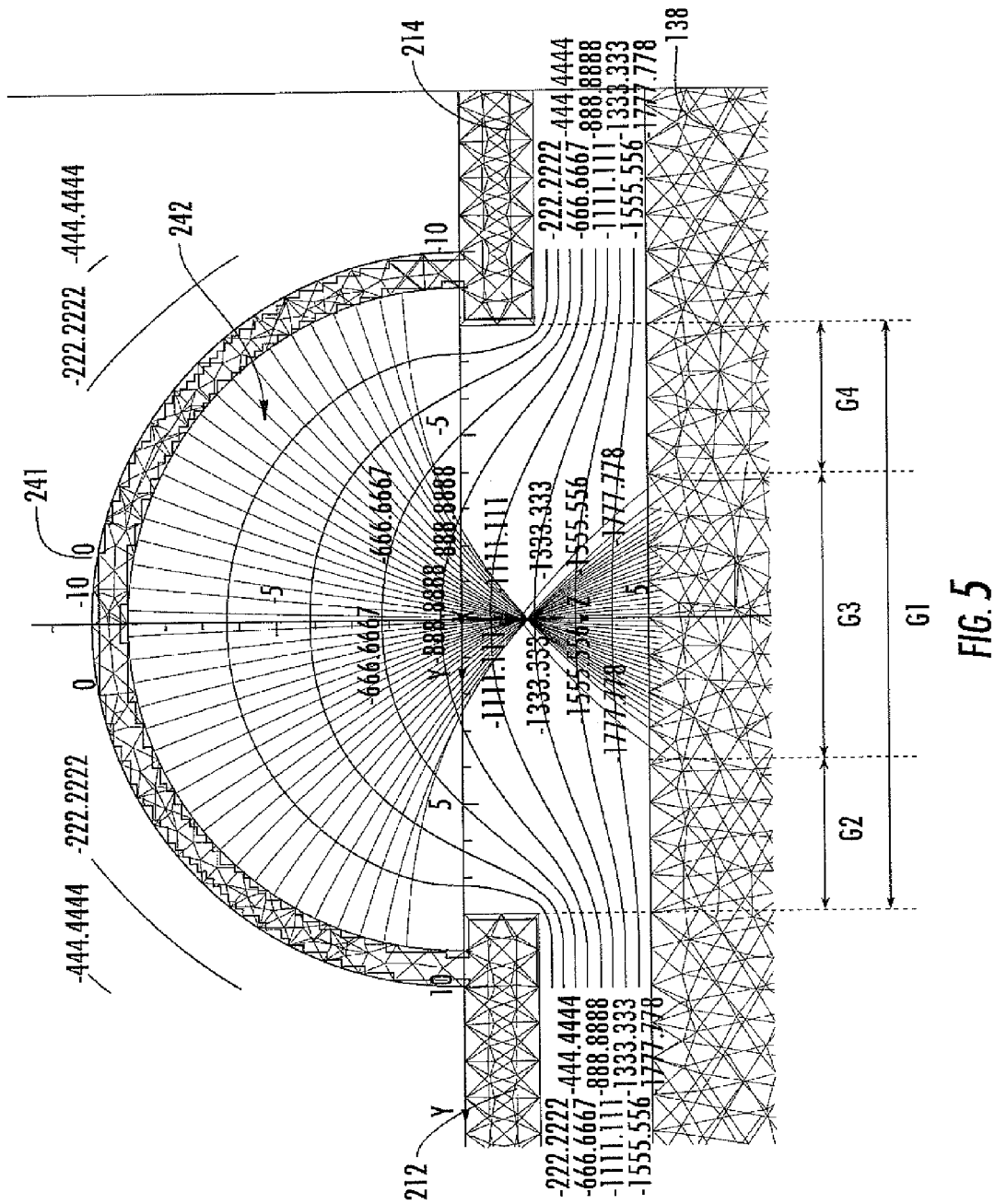
FIG. 5 is a cross sectional view consistent with FIG. 4 illustrating ion trajectories of ions accelerated across the boundary of FIG. 4.

FIG. 5 is a cross sectional view consistent with FIG. 4 illustrating simulated ion trajectories accelerated across the plasma sheath 242 through the gap between the insulators 212 and 214. In a plasma doping apparatus, the ions may be implanted in the workpiece 138 in a central area of the gap spacing due to the shape of the boundary 241 and the electric field lines within the plasma sheath 242. For instance, of the total horizontal spacing (G1) between the insulators 212 and 214, ions strike the workpiece 138 about the central horizontal spacing (G3). No ions strike the workpiece about the peripheral horizontal spacing (G2) and (G4) proximate the insulators 212 and 214 in this embodiment.

Figure 6:
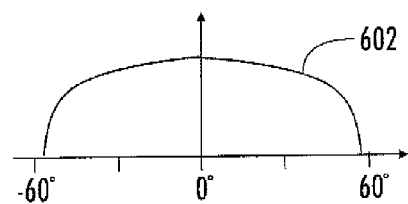
FIG. 6 is a plot of angular ion distributions of the ion trajectories of FIG. 5.

FIG. 6 is a plot 602 of the distribution of incident angles of ions striking the workpiece 138 consistent with the illustrated ion trajectories of FIG. 5. As shown, the plot 602 reveals the incident angles are centered about 0° and vary over a large range of angles from about +60° to −60°. This large range of incident angles enables conformal doping of three dimensional structures. For example, the sidewalls of a trench structure may be more uniformly doped with ions having such a large range of incident angles.

Figure 7:
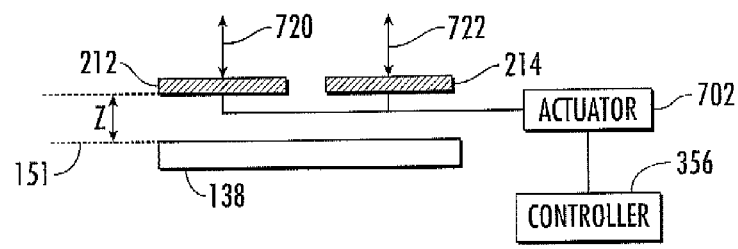
FIG. 7 is a block diagram of a system to control a vertical spacing between a pair of insulators and a workpiece.

Turning to FIG. 7, a block diagram of another embodiment consistent with the present disclosure is illustrated where the vertical spacing (Z) between an insulting modifier and the plane 151 defined by the front surface of the workpiece 138 may be adjusted. The insulating modifier may be the pair of insulators 212 and 214 as detailed in other embodiments. An actuator 702 may be mechanically coupled to the pair of insulators 212 and 214 to drive the insulators in a vertical direction as shown by arrows 720, 722 relative to the plane 151. The Z position of the pair of insulators 212 and 214 relative to the plane 151, and also relative to each other, influences the shape of the boundary between the plasma and the plasma sheath and also the trajectories of the ions striking the workpiece 138. The actuator 702 may be controlled by a controller such as controller 356.

Figure 8:
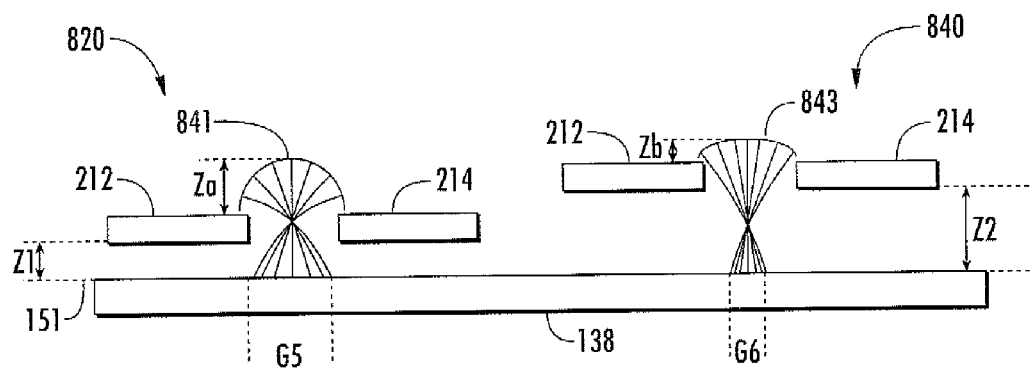
FIG. 8 is a cross sectional view consistent with FIG. 7 illustrating ion trajectories at differing vertical spacing.

FIG. 8 is a cross sectional view consistent with FIG. 7 to illustrate ion trajectories at differing Z positions of the pair of insulators 212 and 214 relative to the plane 151 with all other parameters being equal. In the first relatively short Z gap position 820, the insulators 212, 214 are positioned a first distance (Z1) above the plane 151. In a comparatively taller Z gap position 840, the insulators 212, 214 are positioned a second distance (Z2) above the plane 151, where (Z2)>(Z1). In the first position 820, the boundary 841 between the plasma and the plasma sheath has a convex shape relative to the plane 151. The boundary 841 also has a shape that approximately approaches the shape of a portion of a circumference of a circle where an apex of the arcuate shape is a distance (Za) above a top surface of the insulator 212. In contrast, the boundary 843 in the second position 840 has a shallower shape where the apex of the arcuate shape is a shorter distance (Zb) above the top surface of the insulator 212, or where (Zb)<(Za). The shape of the boundaries 841, 843 combined with the Z gap distances (Z1) and (Z2) and the electric field lines in the plasma sheath, influences the angular spread of the ions striking the workpiece 138. For example, the angular spread of ions striking the workpiece 138 with the relatively short Z gap position 820 is greater than the angular spread of ions striking the workpiece 138 with the relatively longer Z gap position. In addition, ions strike a wider horizontal spacing (G5) of the workpiece 138 with the shorter Z gap position 820 compared to the horizontal spacing (G6) with the taller Z gap position, where (G6)<(G5). Although not illustrated in FIG. 8, the Z gap positions of each insulator 212 and 214 may also be different from each other to further influence the shape of the boundary between the plasma and the plasma sheath and accordingly the angular spread of ions.

Figure 9:
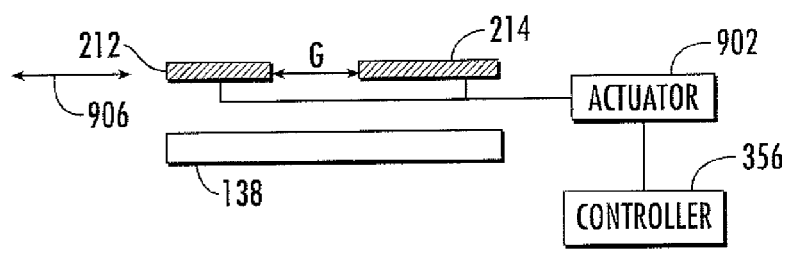
FIG. 9 is a block diagram of a system to control a horizontal spacing between a pair of insulators.

Turning to FIG. 9, a block diagram of another embodiment consistent with the present disclosure is illustrated where the horizontal spacing (G) between insulators 212 and 214 may be adjusted. The horizontal spacing adjustments may in lieu of, or in addition to, the earlier detailed vertical spacing adjustments of FIGS. 8 and 9. An actuator 902 may be mechanically coupled to at least one of the pair of insulators 212 and 214 to drive the insulators in the direction shown by the arrow 906 relative to one another. The actuator 902 may be controlled by a controller such as controller 356.

Figure 10:
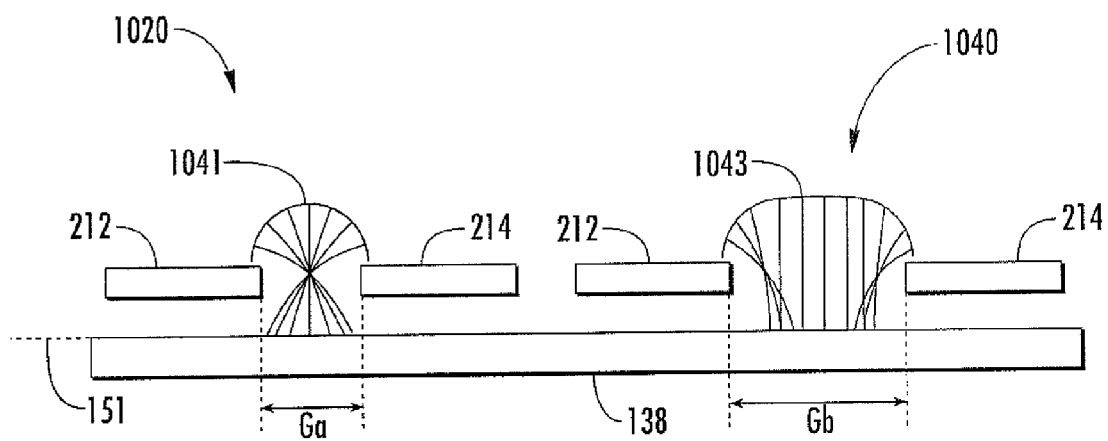
FIG. 10 is a cross sectional view consistent with FIG. 9 to illustrating ion is trajectories at differing horizontal spacing.

FIG. 10 is a cross sectional view consistent with FIG. 9 to illustrate ion trajectories at differing horizontal gap spacing between the insulators 212 and 214 with all other parameters being equal. In the first relatively shorter horizontal gap position 1020, the insulators 212, 214 are positioned a first horizontal distance (Ga) from one another. In a comparatively longer horizontal gap position 1040, the insulators 212, 214 are positioned a second horizontal distance (Gb) from each other, where (Gb)>(Ga). In the first position 1020, the boundary 1041 between the plasma and the plasma sheath has a convex shape relative to the plane 151. The boundary 1041 also has a shape that approximately approaches the shape of a portion of a circumference of a circle. In contrast, the boundary 1043 in the second position 1040 has a convex shape relative to the plane 151 where a central portion of the boundary 1043 is about parallel to the plane 151. As a result, a larger corresponding central portion of the workpiece 138 is struck with ions having about a 0° angle of incidence relative to the plane 151.

Figure 11:
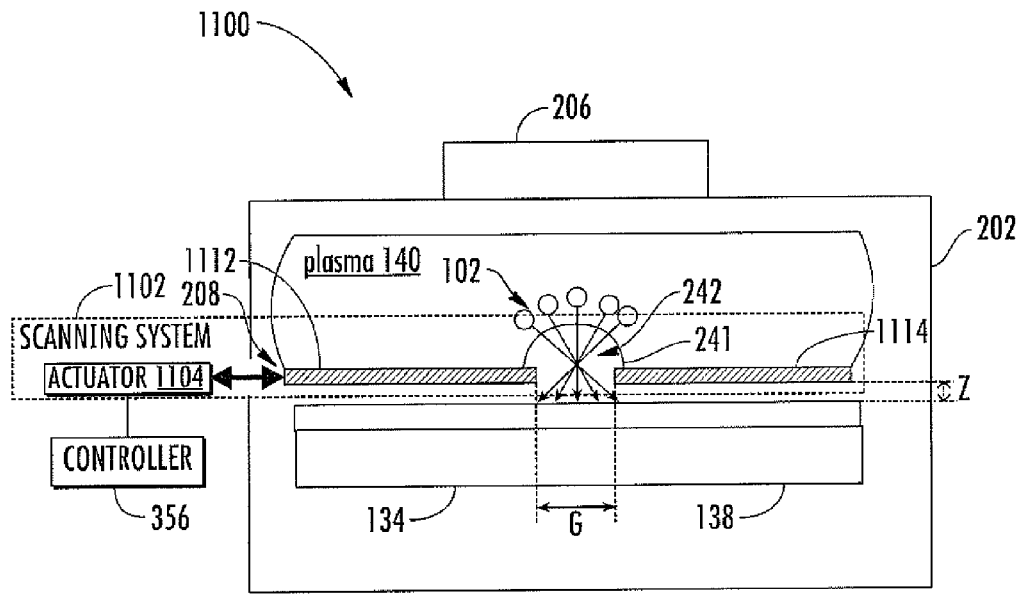
FIG. 11 is a block diagram of a plasma processing apparatus having a scanning system to move a pair of insulating sheets relative to a workpiece.
Figure 12:
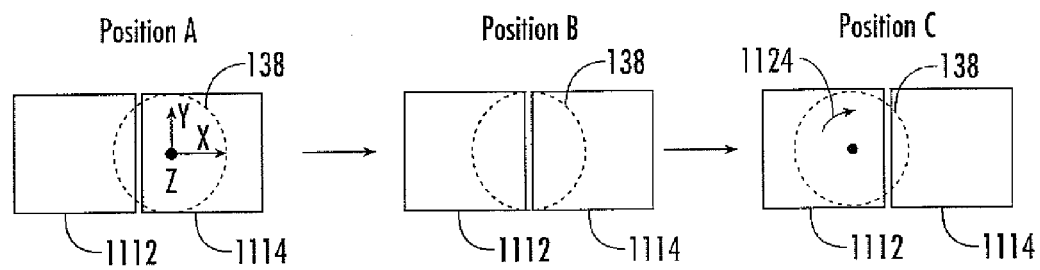
FIG. 12 is a plan view of the insulating sheets of FIG. 11 showing relative movement between the insulating sheets and a disk shaped workpiece.

FIG. 11 is a block diagram of a plasma processing apparatus 1100 having a scanning system 1102 to drive an insulating modifier 208 relative the workpiece 138. In the embodiment of FIG. 11, the insulating modifier 208 includes a pair of square insulating sheets 1112 and 1114 that are best seen in FIG. 12. The scanning to system 1102 may include an actuator 1104 mechanically coupled to the insulating sheets 1112 and 1114 to drive the same. The actuator 1104 may be controlled by a controller such as controller 356.

FIG. 12 is plan view of the square insulating sheets 1112 and 1114 and a disk shaped workpiece 138 to illustrate one example of relative movement between the same. In the embodiment of FIG. 12, the scanning system 1102 may drive the square insulating sheets 1112 and 1114 from Position A, to Position B, and Position C, etc. so that all portions of the workpiece 138 are exposed to the gap defined by the pair of square insulating sheets 1112 and 1114. If a Cartesian coordinate system is defined as detailed in FIG. 12, the insulating sheets 1112 and 1114 are driven in the X direction of FIG. 12. In other embodiments, the insulating sheets 1112 and 1114 or another set of different insulating sheets may be driven in the Y direction or any angle between the X and Y directions. In addition, the workpiece 138 may be rotated as the scanning system 1102 drives the insulating sheets 1112 and 1114 in one direction. The workpiece 138 may also be rotated by a predetermined rotation angle after the scanning system 1102 drives the insulating sheets in one direction. In one example, the rotation may be about a central axis of the workpiece as illustrated by arrow 1124.

Figure 13:
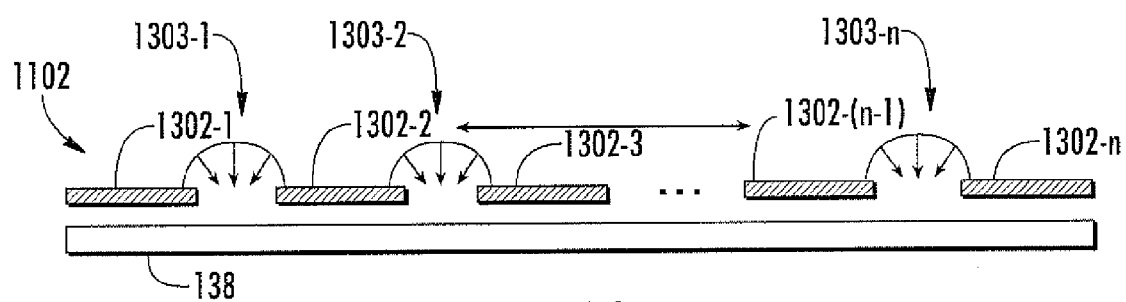
FIG. 13 is a block diagram of a scanning system consistent with FIG. 11 having a plurality of insulators.

Turning to FIG. 13, a scanning system 1102 consistent with FIG. 11 is illustrated. Compared to FIG. 11, the scanning system 1102 of FIG. 13 includes a plurality of insulators 1302-1, 1302-2, 1302-3, . . . 1302-(n−1), and 1302-n that define a plurality of gaps there between 1303-1, 1303-2, . . . 1303-n. The scanning system may drive the plurality of insulators 1302-1, 1302-2, 1302-3, . . . 1302-(n−1), and 1302-n relative to the workpiece 138 so the plurality of gaps 1303-1, 1303-2, . . . 1303-n pass over the workpiece 138.

Accordingly, there is provided an insulating modifier to control a shape of the boundary between the plasma and the plasma sheath. The incident angles of particles that are attracted from the plasma across the plasma sheath may therefore strike an associated workpiece at a large range of incident angles. In one instance, the range of incident angles (θ) may as great as between +60° and −60° centered about 0°. In a plasma doping application, small three dimensional structures on the workpiece may be more uniformly doped. For example, the sidewalls 247 of a trench 244 (see FIG. 2) may be more uniformly doped compared to a conventional plasma doping apparatus with a much lower range of incident angles.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A plasma processing apparatus comprising:
   a process chamber;
   a platen positioned in the process chamber for supporting a workpiece;
   a source configured to generate a plasma in the process chamber having a plasma sheath adjacent to the front surface of the workpiece;
   an insulating modifier configured to control a shape of a boundary between the plasma and the plasma sheath so a portion of the shape of the boundary is not parallel. to a plane defined by a front surface of the workpiece facing the plasma, the insulating modifier comprising a pair of insulators defining a gap there between;
   a bias source configured to bias the wafer relative to the process chamber to attract ions from the plasma across the plasma sheath towards the workpiece, and
   a controller configured to control the source, the gap, and a vertical spacing between the pair of insulators and the plane, to define the shape of the boundary about the gap to be a convex shape bulging outward away from the plane when the ions are accelerated across the plasma sheath towards the workpiece.

2. The plasma processing apparatus of claim 1 wherein the pair of insulators comprise a pair of insulting sheets.

3. The plasma processing apparatus of claim 1, further comprising an actuator mechanically coupled to at least one insulator of the pair of insulators to adjust a horizontal spacing of the gap.

4. The plasma processing apparatus of claim 1, further comprising an actuator mechanically coupled to the pair of insulators to adjust the vertical spacing between the pair of insulators and the plane defined by the front surface of the workpiece facing the plasma.

5. The plasma processing apparatus of claim 1, wherein the pair of insulators are fabricated of quartz.

6. The plasma processing apparatus of claim 1, further comprising a scanning system configured to move the pair of insulators relative to the workpiece.

7. The plasma processing apparatus of claim 1, wherein the insulating modifier comprises a plurality of insulators that define a plurality of gaps there between, and wherein the shape of the boundary about each of the plurality of gaps is a convex shape relative to the plane.

8. The plasma processing apparatus of claim 1, wherein the ions attracted from the plasma across the plasma sheath have at least some ion trajectories that cross one another.

9. The plasma processing apparatus of claim 1, wherein the range of incident angles is about 120° being between about positive 60° and negative 60° centered about 0°.

* * * * *

UNITED STATES PATENT AND TRADEMARK OFFICE
CERTIFICATE OF CORRECTION

PATENT NO. : 8,623,171 B2
APPLICATION NO. : 12/418120
DATED : January 7, 2014
INVENTOR(S) : Ludovic Godet et al.

Page 1 of 1

It is certified that error appears in the above-identified patent and that said Letters Patent is hereby corrected as shown below:

In the Claims

Column 8, Line 25, Claim 1, "not parallel. to" should be changed to --not parallel to--

Signed and Sealed this
Fourth Day of March, 2014

Michelle K. Lee
*Deputy Director of the United States Patent and Trademark Office*